United States Patent [19]
Ito et al.

[11] Patent Number: 5,610,830
[45] Date of Patent: Mar. 11, 1997

[54] AUTOMATIC GENERATION SYSTEM FOR AN ADDITIONAL CIRCUIT PROVIDED IN A LOGIC CIRCUIT DESIGN SUPPORT SYSTEM

[75] Inventors: Noriyuki Ito; Etsuko Mizukami, both of Kawasaki, Japan

[73] Assignee: Fujitsu Limited, Kawasaki, Japan

[21] Appl. No.: 226,867

[22] Filed: Apr. 13, 1994

[30] Foreign Application Priority Data

Jun. 24, 1993 [JP] Japan .................................. 5-153170

[51] Int. Cl.⁶ .................................................. G06F 17/50
[52] U.S. Cl. .......................... 364/490; 364/488; 364/489; 364/491
[58] Field of Search .................................... 364/488–491

[56] References Cited

U.S. PATENT DOCUMENTS

| | | | |
|---|---|---|---|
| 4,635,208 | 1/1987 | Coleby et al. | 364/491 |
| 4,754,408 | 6/1988 | Carpenter et al. | 364/491 |
| 5,132,974 | 7/1992 | Rosales | 371/22.3 |
| 5,212,651 | 5/1993 | Yabe | 364/488 |
| 5,231,590 | 7/1993 | Kumar et al. | 364/491 |
| 5,253,181 | 10/1993 | Marui et al. | 364/489 |
| 5,331,569 | 7/1994 | Iwimai | 364/489 |
| 5,367,468 | 11/1994 | Fukasawa et al. | 364/490 |
| 5,402,356 | 3/1995 | Schaefer et al. | 364/489 |
| 5,410,491 | 4/1995 | Manami | 364/491 |

OTHER PUBLICATIONS

Lin et al., "A Fast & Efficient Algorithm for Determining Fanout Trees in Large Networks", 1991 European Design Automation Conference, pp. 539–544.

Singh et al., "A Heuristic Algorithm for the Fanout Problem," 27th ACM/IEEE Design Automation Conference, pp. 357–360.

Primary Examiner—Kevin J. Teska
Assistant Examiner—Leigh Marie Garbowski
Attorney, Agent, or Firm—Staas & Halsey

[57] ABSTRACT

An automatic generation system of an additional circuit provided in a logic circuit design support system includes: a new distributing point extracting unit for extracting points which distribute signals applied by the additional circuit, from data of new logic circuit before new additional circuit is connected; an old distributing point extracting unit for extracting points which distribute signals applied by the additional circuit, from data of old logic circuit before design change; a distributing point comparing unit for comparing distributing points of the new logic circuit with distributing points of the old logic circuit; a connection point corresponding unit for corresponding connections of the additional circuit to the distributing points of the old logic circuit, and connections of the additional circuit to the distributing points of the new logic circuit, regarding the distributing points which coincide between the new and old logic circuit; an additional circuit changing unit for changing a part of the additional circuit of the old logic circuit so as to distribute signals to branch points added in the new logic circuit; and an additional unit for adding the design-changed additional circuit to the new logic circuit.

6 Claims, 9 Drawing Sheets

INFORMATION OF DESTINATION POINT

Fig.3A
```
(1) IDENTIFICATION NAME
(2) ARRANGED POSITION
(3) NAME OF FAN-OUT-GROUP
(4) SEQUENCE NUMBER IN FAN-OUT GROUP
(5) IDENTIFICATION NAME OF SOURCE POINT
```

INFORMATION OF SOURCE POINT

Fig.3B
```
(1) IDENTIFICATION NAME
(2) ARRANGED POSITION
```

```
(1)  procedure EXPAND
(2)      O ← {O_j,x | DP BEFORE DESIGN CHANGE} ;
(3)      S ← {S_j, NULL, determ=0 | DP AFTER DESIGN CHANGE} ;
(4)      for (all S_j, NULL, determ=0 ∈ S) begin
(5)          if (S_j, NULL, determ=0 == O_i,x ∈ O)
(6)              S_j, NULL, determ=0 → S_j,x, determ=1 ;
(7)      end
(8)      while ( {S_j, NULL, determ=0 ∈ S} ≠ φ) begin
(9)          for ( all x ∈ {g | S_j, x, determ=1 ∈ S} ) begin
(10)             A_x ← {S_j, x, determ=1 | S_j, x, determ=1 ∈ S} ;
(11)             B  ← {S_j, NULL, determ=0 | S_j, NULL, determ=0 ∈ S} ;
(12)             for (i=0; i<|B|; i++) begin
(13)                 T ← {S_j, NULL, determ=0 | S_j, NULL, determ=0
                          NEAREST TO A_x ∈ B,
                          S_j, NULL, determ=0 ∈ A_x NEAREST FROM B} ;
(14)             if ( (NUMBER OF FAN-IN OF POINTS WITHIN A_x) +
                       (NUMBER OF FAN-IN OF POINT WITHIN T)
                       <NUMBER OF LIMITATION)
(15)                 begin
(16)                     r ← STEINER (A_x ∪ T) ; /*CALCULATION OF SIZE OF
                                                    STEINER TREE */
(17)                     if (r + α <= LIMITVALUE OF WIRE LENGTH) begin
(18)                         S_j, NULL, determ=0 IN T → S_j, x, determ=1 ;
(19)                         S ← S - T ;
(20)                         A_x ← A_x ∪ T ;
(21)                     end
(22)                     else break;
(23)             end
(24)         end
(25)     end
(26) end
```

5,610,830

AUTOMATIC GENERATION SYSTEM FOR AN ADDITIONAL CIRCUIT PROVIDED IN A LOGIC CIRCUIT DESIGN SUPPORT SYSTEM

BACKGROUND OF THE INVENTION

1. Field of the Invention

The present invention relates to an automatic generation system for additional circuits provided in a logic circuit design support system. The present invention is advantageously used when changing the design of a logic circuit by including various additional circuits, for example, a reset circuit, a clock circuit, or a diagnostic circuit.

2. Description of the Related Art

In a logic circuit design support system, a computer is usually used to design and layout a logic circuit. In general, these processes are called "logic design" and "layout design".

In the logic and layout design processes, various additional circuits, for example, a reset circuit which generates a reset signal when initializing the logic circuit, a clock circuit which generates a clock for the logic circuit, and a diagnosis circuit for diagnosing the logic circuit by using a scan-out and scan-in operation, are automatically added to the logic circuit after completion of the basic logic design and the layout design. In general, these additional circuits are called "distributing additional circuits".

When automatically generating the additional circuits, it is necessary to determine points in which the additional circuits are to be connected in the logic circuit, and these points are grouped so as to satisfy various conditions of the logic circuit, for example, the limit for wiring length in the network and the number of fan-outs. The additional circuits must be connected so as to also satisfy the above conditions. After the above processes, the additional circuits are provided in the logic circuit.

In above processes, when the logic circuit is changed after completion of the basic logic design, it is necessary to change the additional circuits in accordance with above design change.

SUMMARY OF THE INVENTION

The object of the present invention is to provide an automatic generation system for additional circuits provided in a logic circuit design support system which can easily provide new additional circuits when the design and layout of the logic circuit is changed.

In accordance with the present invention, there is provided an automatic generation system for additional circuits provided in a logic circuit design support system which provides the additional circuits to a logic circuit after completion of design, the automatic generation system including;

a new distributing point extracting unit for extracting points which distribute signals applied to the additional circuit, from data on the new logic circuit before new additional circuits are connected;

an old distributing point extracting unit for extracting points which distribute signals applied by the additional circuit, from data on the old logic circuit before the design change;

a distributing point comparing unit operatively connected to both the new and the old distributing point extracting units for comparing distributing points of the new logic circuit with distributing points of the old logic circuit;

a connection point corresponding unit operatively connected to the distributing point comparing unit for corresponding the connections of the additional circuit to the distributing points of the old logic circuit, to the connections of the additional circuit to the distributing points of the new logic circuit, regarding the distributing points which coincide between the new and old logic circuits;

an additional circuit changing unit operatively connected to the distributing point comparing unit for changing a part of the additional circuit of the old logic circuit so as to distribute signals to branch points added in the new logic circuit; and an additional unit operatively connected to the connection point corresponding unit and the additional circuit changing unit for adding the design-changed additional circuit to the new logic circuit.

In one preferred embodiment, the additional circuit changing unit comprises an expanding processing unit for expanding fan-out groups for distributing points in the old logic circuit, and including the fan-out group which satisfies a predetermined limitation on the number of connections for distributing lines regarding the distributing points which are added in the new logic circuit; and a new group generating unit for generating new fan-out group which satisfies the above limitation, and assigning distributing points to the new fan-out group regarding the distributing points which are not included in any fan-out groups.

In another preferred embodiment, the expanding processing unit comprises a unit for prohibiting processing which include the distributing points added to the new logic circuit, with regard to the fan-out groups which were previously designated as being out of expanding object (i.e. it is not object of the expanding process).

In still another embodiment, the automatic generation system of an additional circuit further comprises an additional regular circuit storage unit for storing information on a regular additional circuit which is added to the designed logic circuit; and an additional regular circuit updating unit for extracting information of the additional circuit from the old logic circuit, and updating information of the regular additional circuit in accordance with the extracted data.

In still another embodiment, the information in the regular additional circuit which is stored in the additional-regular circuit storage unit includes information which includes non-used circuit portions in the logic circuit, and the non-used circuit portions are used in the additional circuit changing unit.

DESCRIPTION OF THE PREFERRED EMBODIMENTS

Before describing the preferred embodiments, a basic process of design change will be explained in detail below.

Figure 1A:
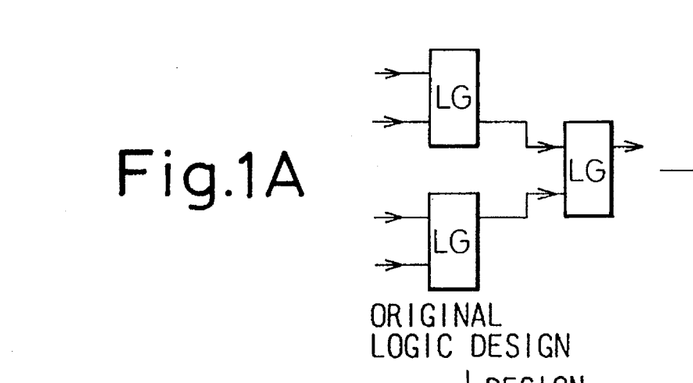
FIGS. 1A to 1D are explanatory views for basic process of design change of a logic circuit.
Figure 1B:
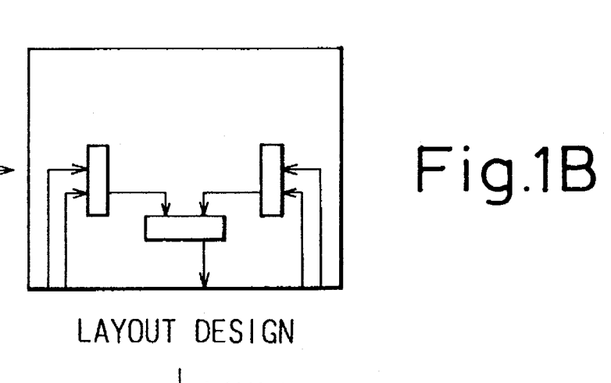
Figure 1C:
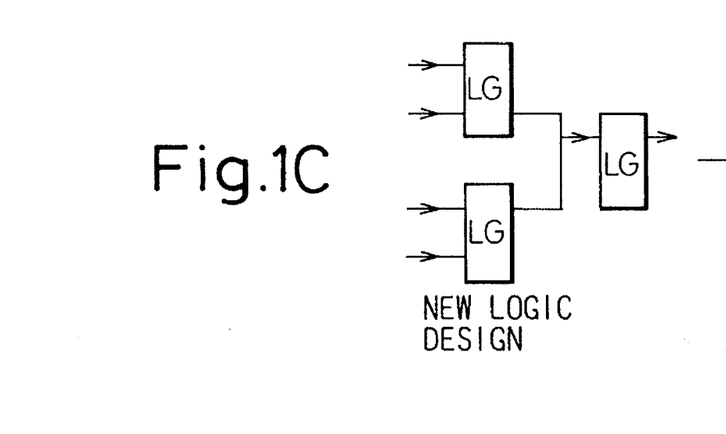
Figure 1D:
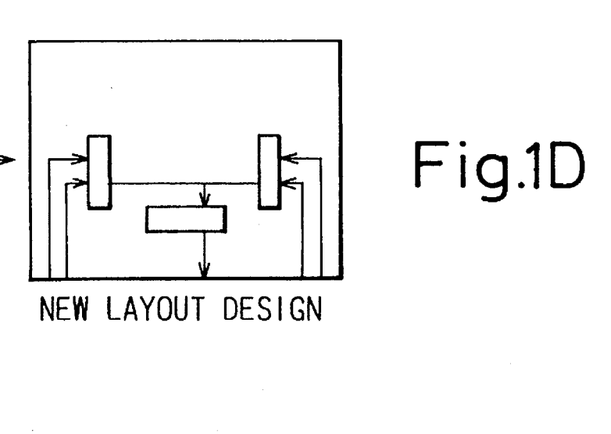

FIGS. 1A to 1D are explanatory views for basic process of the design change. In all drawings, LG denotes a logic gate used as a repeater gate. FIG. 1A shows a block diagram based on an original logic design, FIG. 1B shows a layout design in accordance with the original logic design, FIG. 1C shows a block diagram after design change from the original logic design, and FIG. 1D shows the layout design after design change of the logic circuit.

First, the logic design is started as shown in FIG. 1A. Next, the layout design is performed for arrangement of logic gates LG and wiring among logic gates LG as shown in FIG. 1B. After completion of above basic logic design and layout design, when the original logic circuit is partially changed as shown in FIG. 1C, the layout design is also changed as shown in FIG. 1D.

In above basic process, the additional circuits, i.e., a reset circuit, a clock circuit, etc., are automatically generated and added to the original layout design shown in FIG. 1B in a first stage. In general, in an automatic generation process for the additional circuits, first, "points" for connecting the additional circuits are determined in the logic circuit, and all points are grouped so as to satisfy various conditions of the logic circuit, for example, limitation of wiring length, and the number of fan-outs. After completion of above processes, the additional circuits are generated so as to satisfy to above conditions.

After completion of the logic design, the layout design and additional circuits, when the logic circuit is changed, the additional circuits must be changed in accordance with the design change.

In a conventional art, the additional circuits are redesigned for every design change. Accordingly, it is difficult to effectively provide the new additional circuits.

Further, when the additional circuits are redesigned distributing lines (i.e., the number of wires to distribute a signal from one logic gate, or the number of fan-outs) must be changed.

When the distributing lines are changed, delays occur in signals to be distributed. In this case, when the points connecting the additional circuits are changed (i.e., added or deleted), it is necessary to newly group the points so as to satisfy the conditions, i.e., the limitation on wiring length and the number of fan-outs.

Accordingly, in a conventional art, it is necessary to repeatedly perform an automatic generation of the additional circuits from an initial stage of the logic design for every design change even if a new LSI circuit is substantially the same as the original one. As a result, a lot of time is also required for the complete design of the logic circuit.

In the present invention, even if the design change of the logic circuit is performed, the additional circuits, which are generated in the first stage of the design, are utilized without any design change thereof. As a result, it is possible to minimize the design-changed portions of the additional circuits which are automatically generated.

Figure 2:
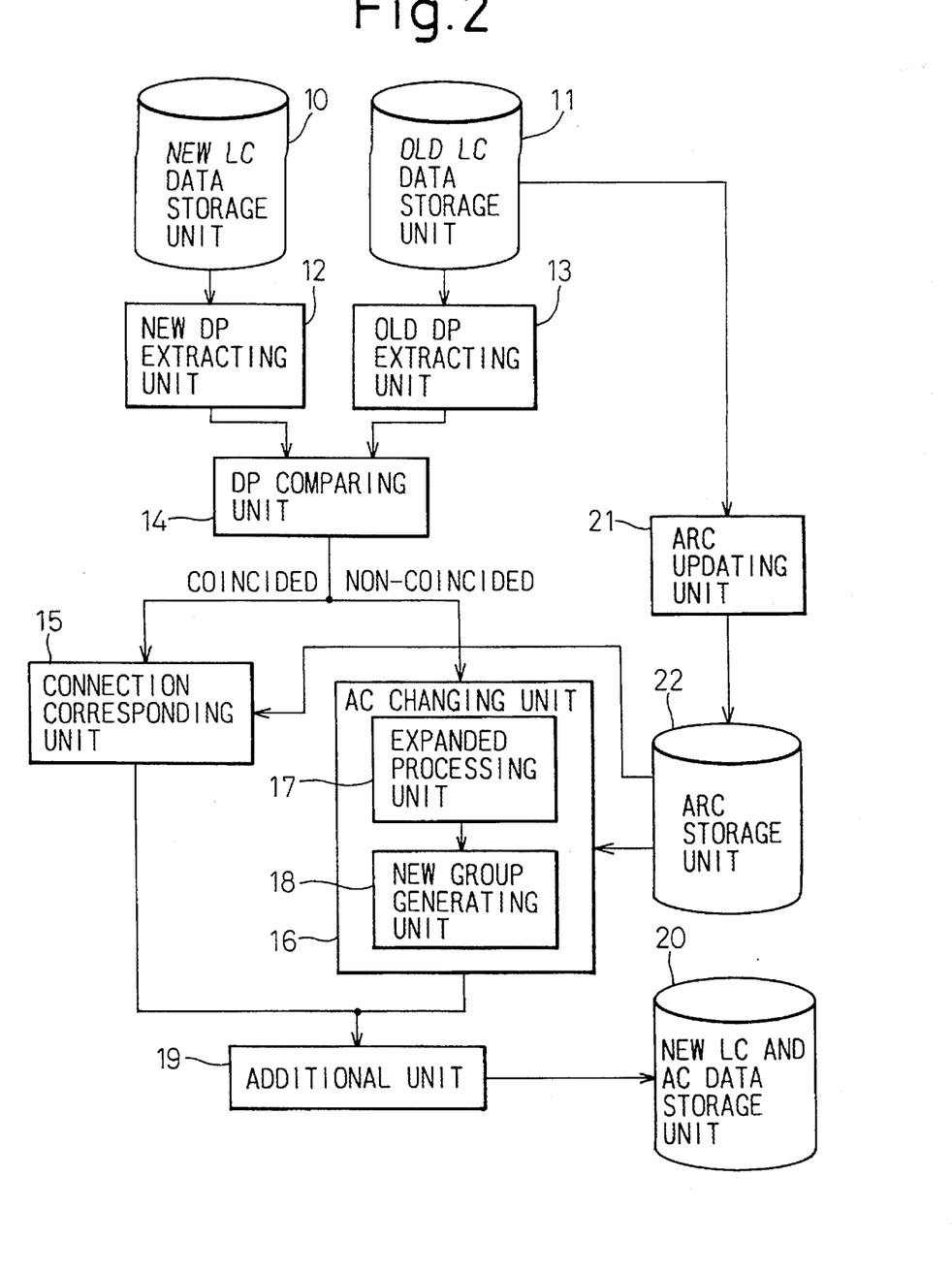
FIG. 2 is a basic block diagram of an automatic generation system for additional circuits according to the present invention.

FIG. 2 is a basic block diagram of an automatic generation system for additional circuits according to the present invention. All structural elements are explained in detail below.

Reference number 10 denotes a new logic circuit (LC) data storage unit for storing data of a new logic circuit after new additional circuits are connected. Reference number 11 denotes an old logic circuit (LC) data storage unit for storing data of an old logic circuit before design change.

Reference number 12 denotes a new distributing point (DP) extracting unit for reading the new logic circuit data from the storage unit 10, and extracting the points which distribute signals applied in the additional circuits. Reference number 13 denotes an old distributing point (DP) extracting unit for reading the old logic circuit data from the storage unit 11, and extracting the points which distribute signals applied in the additional circuit.

Reference number 14 denotes a distributing point (DP) comparing unit for comparing the distributing point extracted by the unit 12 with the distributing point extracted by the unit 13.

Reference number 15 denotes a connection point (CP) corresponding unit for corresponding the connection of the additional circuits on the distributing points in the old logic circuit to the connection of the additional circuits on the distributing points in the new logic circuit when the distributing points in the new and old logic circuits coincide.

Reference number 16 denotes an additional circuit (AC) changing unit for changing a part of additional circuits of the old logic circuit so as to distribute signals to branch points which are added in the new logic circuit. In this case, data for the additional circuits of the old logic circuit are stored in an additional-regular circuit (ARC) storage unit 22.

Further, the additional circuit changing unit 16 includes an expanded (EX) processing unit 17 and a new group generating unit 18. The expanded processing unit 17 expands a group of fan-outs for the distributing points in the old logic circuit so as to satisfy distributing points which are added by the new logic circuit, and includes them in the fan-out groups which satisfy a predetermined limitation of connections of the additional circuits. In this case, regarding the fan-out groups which are previously designated as being out of expanding process, additional new distributing points are not included into the fan-out group.

The new group generating unit 18 generates new fan-out groups which satisfy a predetermined limitation for connections regarding the distributing points which are not included in the fan-out groups in the expanded processing unit 17, and assigns the distributing points to the new fan-out groups.

Reference number 19 denotes an additional unit for adding the design-changed new additional circuits to the new logic circuit, generates data of new logic circuit connected by the new additional circuits, and stores the data into a new logic circuit (LC) and additional circuit (AC) data storage unit 20.

The additional-regular circuit (ARC) storage unit 22 for storing data for the additional-regular circuit which becomes an original circuit to be added to the new logic circuit. The storage unit 22 is updated by an updating unit 21 when it is necessary.

The updating unit 21 extracts information for the additional circuits from the data storage unit 11, and updates information for the additional circuits which are stored in the storage unit 22 in accordance with information extracted from the storage unit 11.

The additional-regular circuit stored in the storage unit 22 is provided in accordance with the maximum number of distributing lines, and the data for the additional-regular circuit includes information as to circuit portions which are not used (non-used circuits) in the original logic circuit. Accordingly, the additional circuit changing unit 16 utilizes above non-used circuits, and generates the additional circuits which are added to the new logic circuit.

Figure 3A:
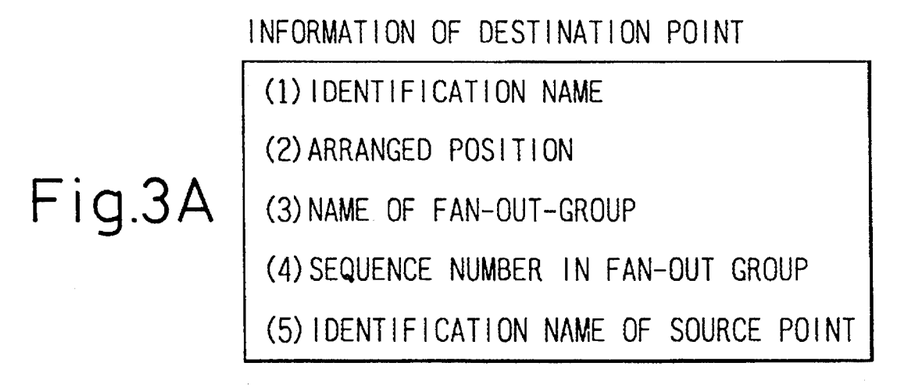
FIG. 3A shows information on destination points to be distributed.
Figure 3B:
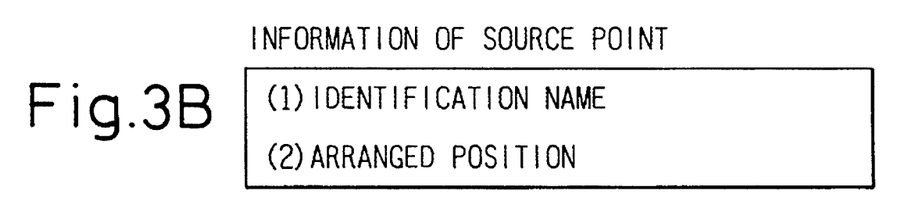
FIG. 3B shows information of source points to be distributed.

FIGS. 3A and 3B show one example of information of points. FIG. 3A shows information of destination points to be distributed, and FIG. 3B shows information of source points to be distributed. The old distributing point extracting unit 13 extracts information of the destination points and the source points from the data of the old logic circuit before a design change, and the new distributing point extracting unit 12 extracts information of the destination points from the data of the new logic circuit after the design change.

As shown in FIG. 3A, information of destination points are formed by (1) an identification name of point, (2) an arranged position of the identification name, (3) a fan-out group name, (4) a sequence number in fan-out group, and (5) an identification name of source point.

As shown in FIG. 3B, information of a source point is formed by (1) an identification name, and (2) an arranged position of the identification name. In this case, an identification number can be used instead of the identification name.

The distributing point comparing unit 14 accepts information for destination points in the new logic circuit, and compares the destination points before a design change with the destination points after a design change. As a result of comparison, when the destination points are the same, the fan-out group name before a design change is applied to the fan-out group name after a design change.

Next, when the destination points are different each other, the fan-out name is determined in accordance with grouping operation of points as explained below. That is, regarding the different destination points, the expanding processing unit 17 determines whether or not the destination points can be included in the present fan-out group in accordance with the number of fan-out and limitation on the length of the network which is defined by the Steiner tree.

After above process, regarding points which are not expanded in any present fan-out group, the new group generating unit 17 generates new fan-out group, and performs the grouping operation.

Further, as another embodiment of above expanding process, instead of that all present fan-out groups are set to the object of the expanding operation, only a particular fan-out group can be set as the expanding object. On the contrary, when the particular fan-out groups are set to being out of the expanding object, it is necessary to apply a particular mark to such particular fan-out groups which are required as being out of the expanding object. Further, the fan-out groups having this particular mark are omitted in the expanding process. Accordingly, it is possible to localize change portions of the distributing lines in accordance with above expanding process.

Figure 4:
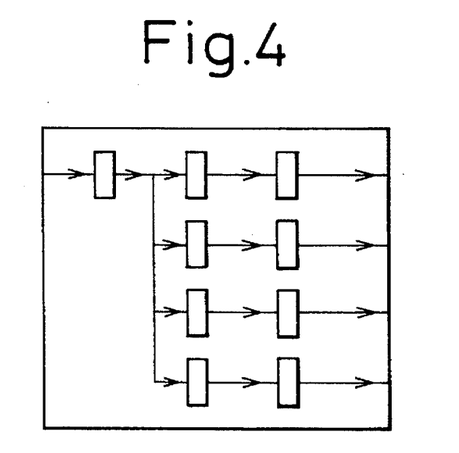
FIG. 4 shows one example of an additional-regular circuit used as a standard circuit.

FIG. 4 shows one example of the additional-regular circuit used as a standard circuit. The standard circuit of the distributing lines is provided in accordance with the maximum distributing lines. In this circuit, when the maximum (MAX) of the final stage of the distributing lines is "n", it is possible to distribute signals to 4×n points as the maximum value.

As a result of the grouping operation for destination points based on the arranged positions, an output of each final stage of the additional circuit corresponds to each group, and is distributed to the corresponding point within each group. At that time, the outputs of the final stage, which do not correspond to any group, are deleted. As a result, the final distributing lines are generated and included in the new logic circuit.

Figure 5:
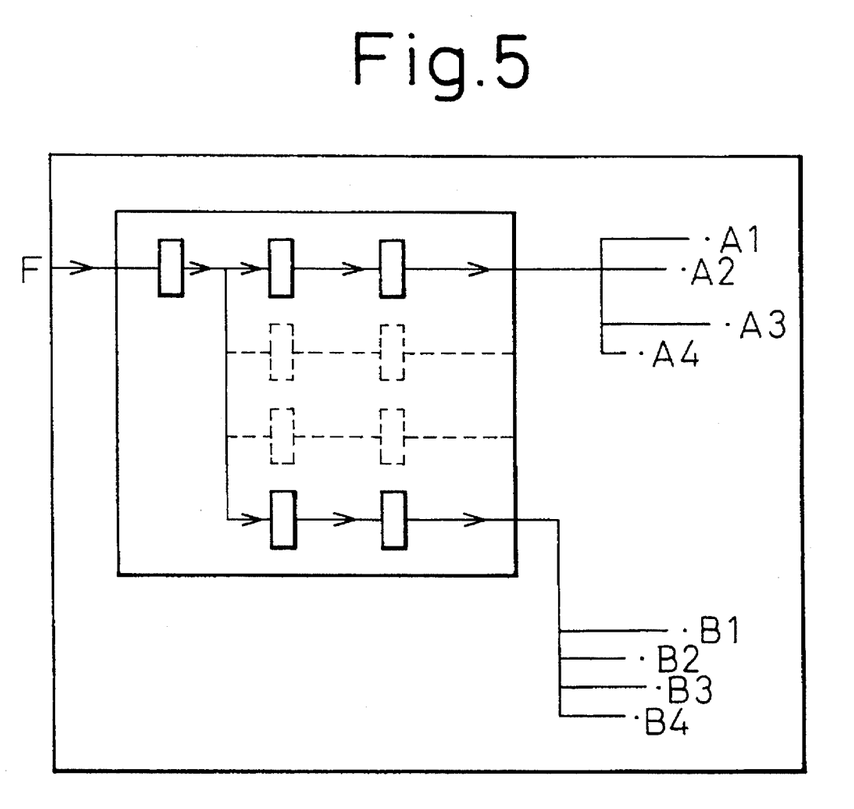
FIG. 5 shows one example of a circuit including distributing lines.

FIG. 5 shows one example of the circuit including the distributing lines. In the drawing, A1 to A4 and B1 to B4 denote distributing points, and F denotes the source point. The dotted lines denote unnecessary circuits in the final distributing line. In this embodiment, these unnecessary circuits are included in the actual logic circuit by attaching the particular mark indicating that these circuit do not exist in actual lines. The circuits including the particular mark are processed so as not to be found by a circuit designer. This means that, for example, the data of the dotted lines are held, but the symbols of these circuits are omitted.

The addition or deletion of the repeater gates is permitted in this circuit. When the destination points are increased or decreased in accordance with the design change, the distributing lines are generated again. The standard circuit extracts the additional circuits, which are previously generated and include the circuits having the particular mark, from the additional circuits before design change, and uses this extracted additional circuit as the additional-regular circuit to generate the new 10 additional circuits.

The additional-regular circuit can be checked by using a method of comparing two additional circuits. First, the repeater gates indicated by solid lines are added to the target logic circuit, and the addition or deletion of the repeater gates is permitted in this target logic circuit. After above processes, when the destination points increase or decrease based on the design change of this target logic circuit, the distributing lines are generated again At that time, the additional-regular circuit is provided by comparing the standard circuit, which is used for generating the additional circuits before design change, with the additional circuit which is extracted from the logic circuit after addition or deletion of the repeater gates. After comparison, the new additional-regular circuit is provided by reflecting the addition or deletion of the repeater gates.

Figure 6A:
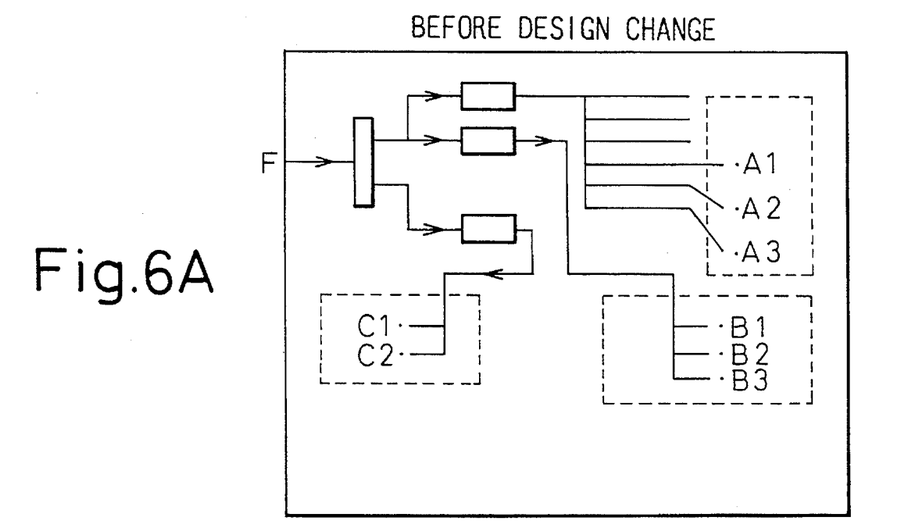
FIGS. 6A and 6B show one example of generation of the additional circuit in the case before design change (6A) and in the case of after design change (6B)
Figure 6B:
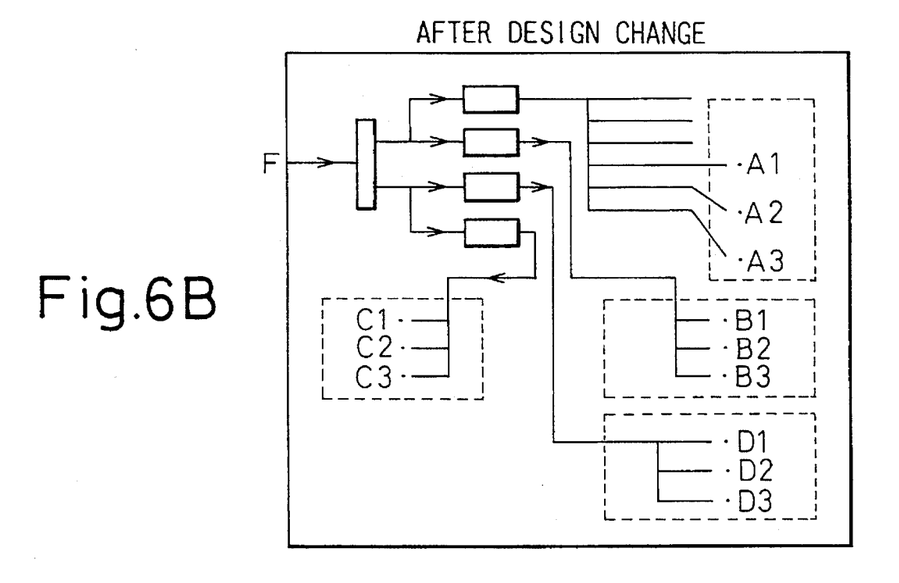

FIGS. 6A and 6B show one example of generation of the additional circuit. FIG. 6A is the case before design change, and FIG. 6B is the case of after design change. In the drawing, F denotes the source point which distributes signals to the distributing lines, and A to D denote destination points. Further, rectangular areas surrounded by dotted lines represent grouping area. These areas are provided in accordance with the number of fan-outs which are determined based on the driveability of the final gate, and the number of groups necessary to limit the wiring length of the network. As shown in FIG. 6A, three groups A to C are provided before design change.

As shown in FIG. 6B, four groups A to D are provided after design change. That is, four distributing points C3 and D1 to D3 are added after design change. The distributing point extracting unit 12 extracts distributing points which satisfy the number of fan-outs and the limit on the wiring length of network. In this embodiment, since the distributing point C3 satisfies the conditions to be included in the group C, the process is performed so as to include the point C3 into the group C.

Further, the new grouping operation is performed to the distributing points D1 to D3 which are not expanded in accordance with the number of fan-outs and the limit of the wiring length of the network. In this embodiment, the new groups are generated so as to connect the distributing points D1 to D3 as shown in FIG. 6B.

The following explanation will be given of the limitation of the fan-out groups which become the object of the expanding process (EXPAND). In the circuit before design change as shown in FIG. 6A, the particular mark, which indicates whether or not the expanding process is necessary, is previously attached to each group A to C. In this example, when the particular mark which indicates being out of object is attached to the group C, the point C3 can not be included into the group C and must be included in another group. As explained above, since the particular mark indicating being out of object can be designated and the group to be expanded can be limited, it is possible to localize the changed portions of the additional circuit.

Figure 7A:
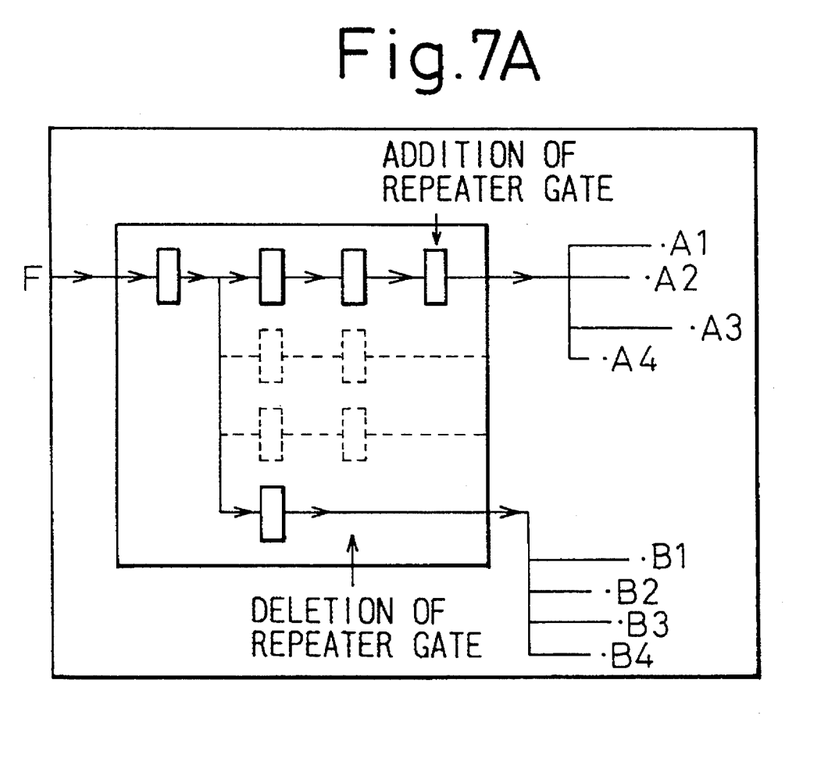
FIGS. 7A to 7C show one example of extraction of an additional-regular circuit.
Figure 7B:
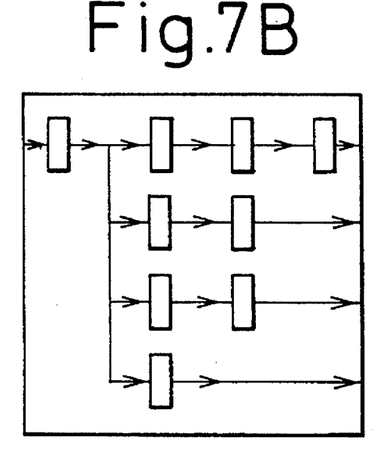
Figure 7C:
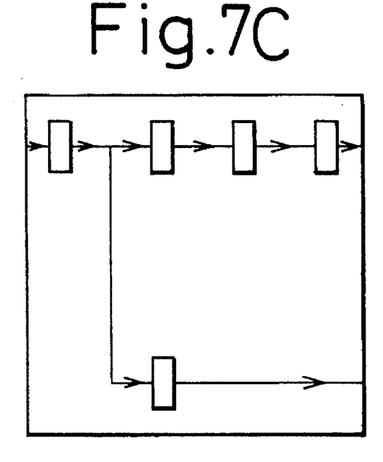

FIGS. 7A to 7C show one example of extraction of the additional-regular circuit. FIG. 7A shows an example of addition and deletion of the repeater gates from the circuit shown in FIG. 5. After the additional circuit is automatically patterned as shown in FIG. 5, necessary repeater gates are added and unnecessary gates are deleted from the additional circuit as shown in FIG. 7A through design change. Further, when destination points of this additional circuit are increased or decreased in accordance with design change, it is necessary to regenerate new additional circuits.

In this case, in order to reflect the added and deleted repeater gates into the additional circuit after the design change as shown in FIG. 7B, the additional circuit including non-used portions (dotted line portions) is extracted from the circuit in FIG. 7A. This circuit, shown in FIG. 7B, is used as the additional-regular circuit in the generation of additional circuits after the design change.

Further, when the additional-regular circuit is generated based on the comparison of the distributing line, first, the distributing lines are taken from the circuit shown in FIG. 7A. The resultant circuit is shown in FIG. 7C. As shown in FIG. 7C, it is not necessary to include the dotted line portions of FIG. 7A. Further, by comparing the additional-regular circuit shown in FIG. 4 with the circuit shown in FIG. 7C, it is possible to recognize the addition or deletion on the repeater gates.

In FIG. 7C, one repeater gate is added and one repeater gate is deleted. As is obvious, since the circuit shown in FIG. 7B can be provided from the addition and deletion of the repeater gates based on the circuit shown in FIG. 4, the circuit shown in FIG. 7B is used as the additional circuit in the generation of the additional circuit after design change.

Figures 8A, 8B:
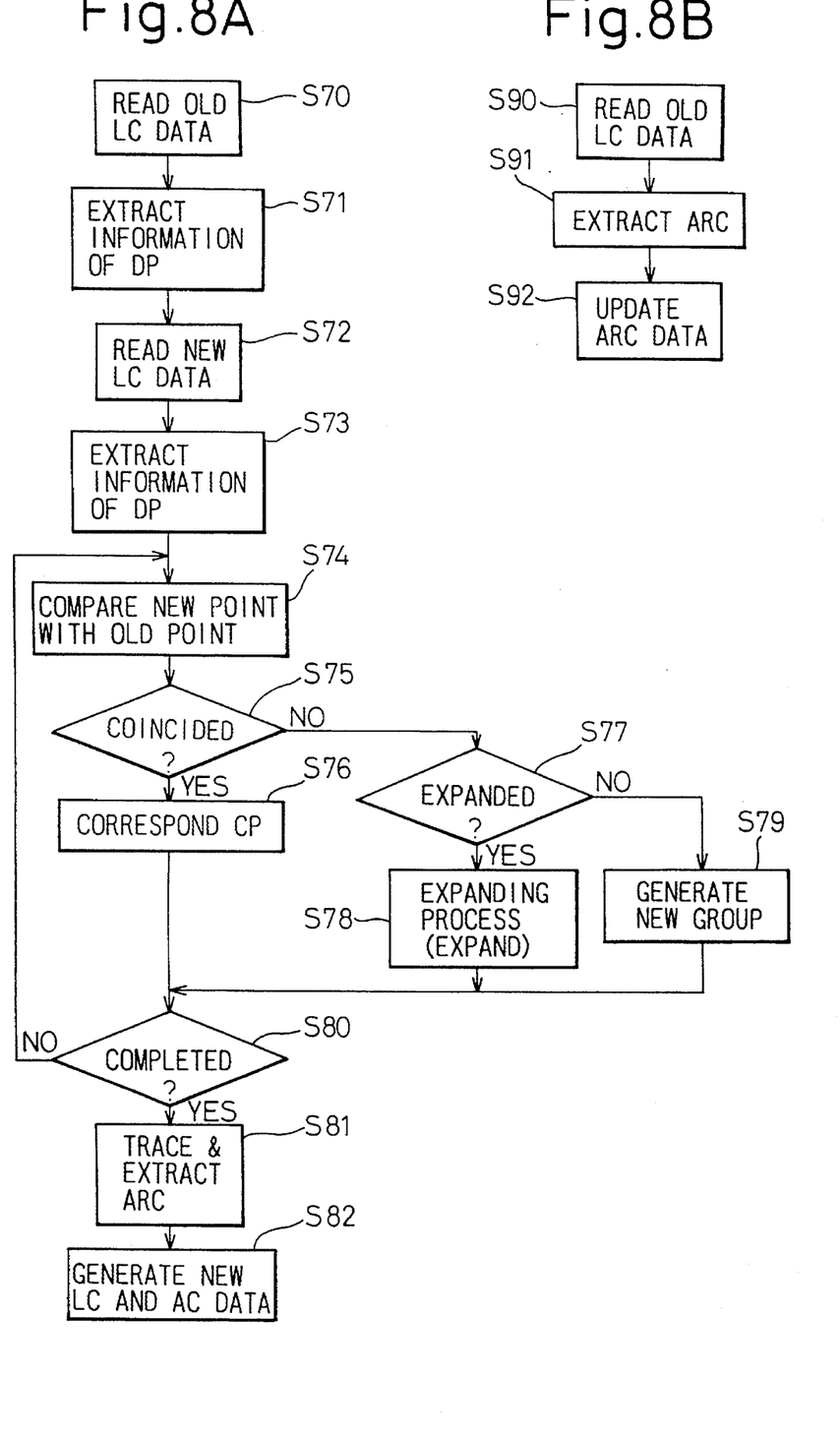
FIGS. 8A and 8B show process flowcharts according to an embodiment of the present invention.
Figure 9A:
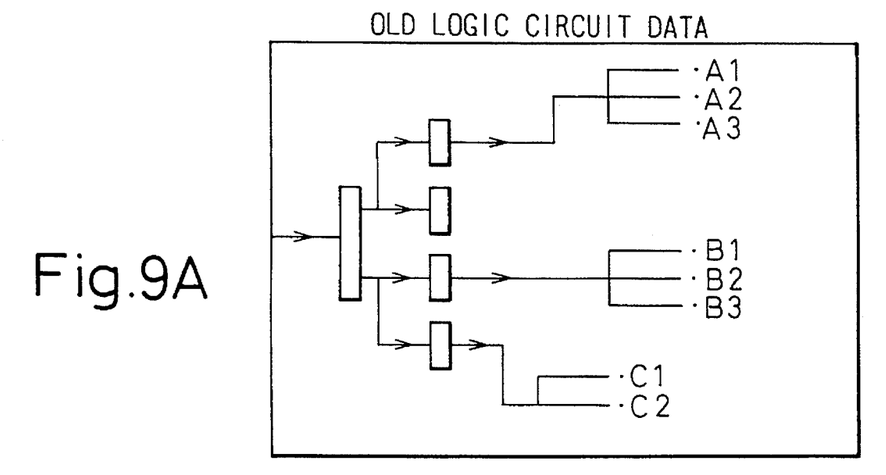
FIGS. 9A and 9B. show one example of design change of the logic circuit.
Figure 9B:
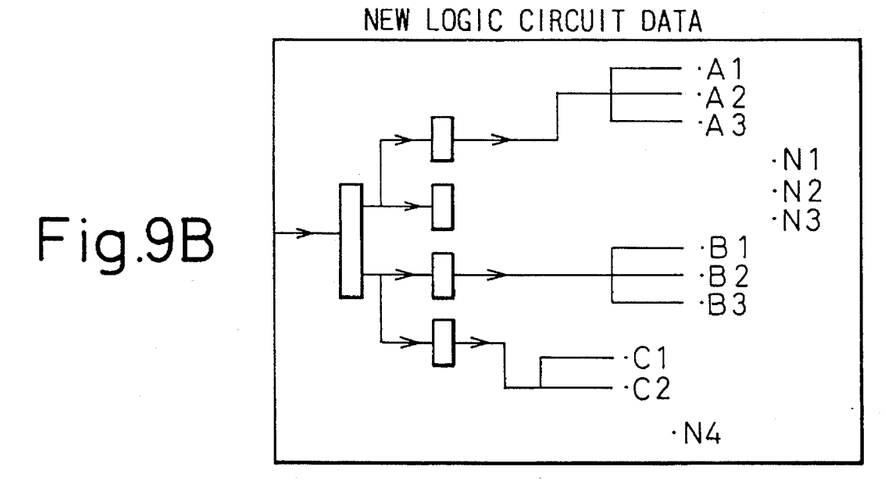
Figure 10:
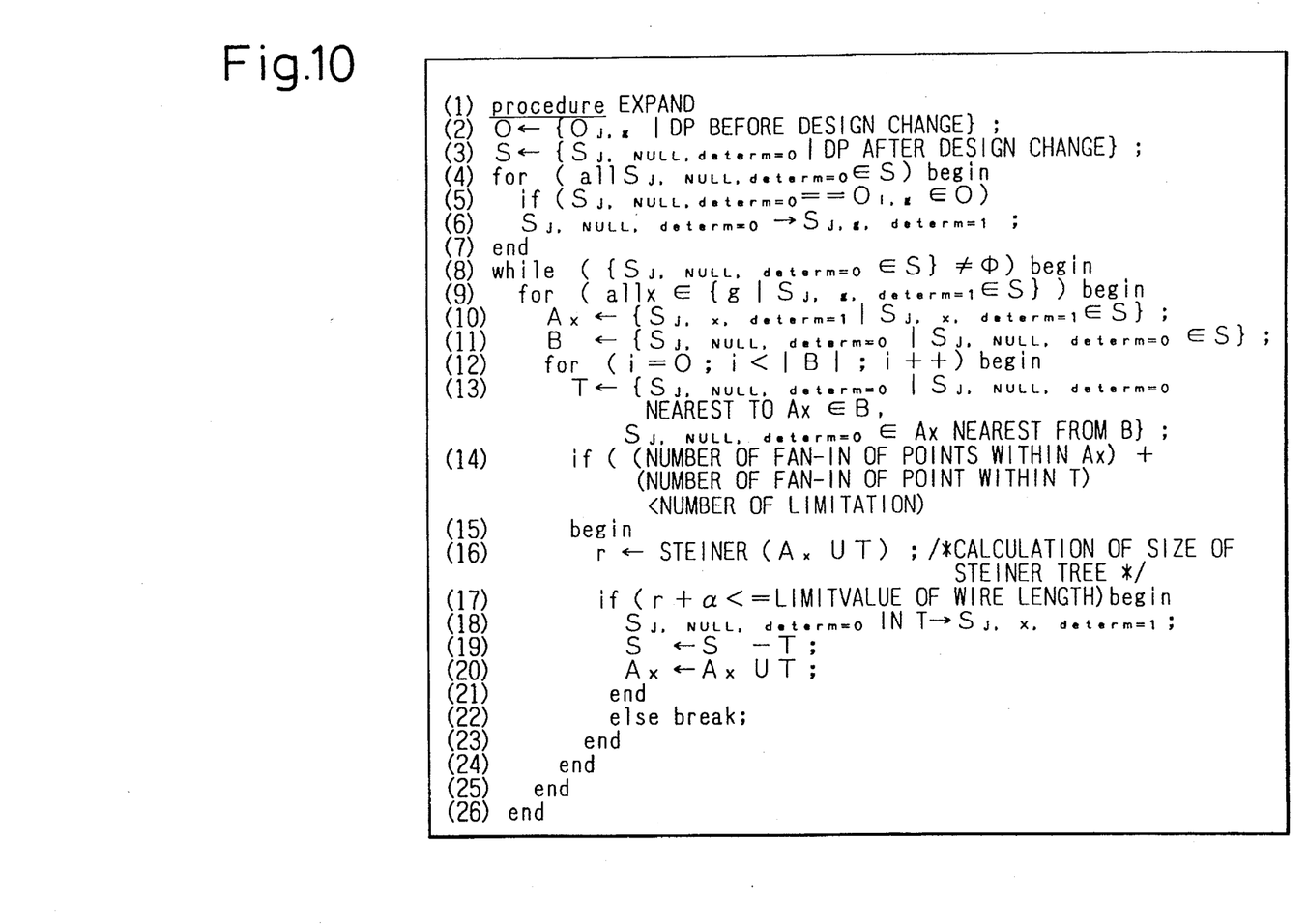
FIG. 10 is an explanatory view of an expanding process according to an embodiment of the present invention.

FIGS. 8A and 8B show process flowcharts according to an embodiment of the present invention, FIGS. 9A and 9B show one example of design change of the logic circuit, and FIG. 10 is an explanatory view of the expanding process according to an embodiment of the present invention. The embodiment will be explained in detail with reference to FIGS. 8A to 10.

In FIG. 9A, old logic circuit data are provided, and in FIG. 9B, new logic circuit data are provided. In FIG. 9A, A1 to A3, B1 to B3 and C1 and C2 denote the distributing points of the old logic circuit data. In FIG. 9B, A1 to A3, B1 to B3, and C1 and C2 denote the same distributing points of the old logic circuit data, and N1 to N4 denote the new distributing points added by the new logic circuit data. Since the additional circuit for the new distributing points N1 to N4 are not determined in this stage, the additional circuit based on the new distributing points is not shown in FIG. 9B.

The process flowcharts shown in FIGS. 8A and 8B will be explained in detail with reference to FIG. 2 and FIGS. 9A and 9B.

In step S70, the old logic circuit (LC) data in FIG. 9A is read from the old logic circuit data storage unit 11 in FIG. 2.

In step S71, the distributing points (DP) A1, A2, ..., C2 are extracted from the old distributing point extracting unit 13.

In step S72, the new logic circuit data in FIG. 9B is read from the new logic circuit data storage unit 10.

In step S73, the distributing points are extracted from the new distributing point extracting unit 12.

In step S74, the new and old distributing points are compared by the distributing point comparing unit 14.

In step S75, after result of comparison, it is determined that the new distributing points A1 to A3, B1 to B3, C1 and C2 coincide with the old points, and the new distributing points N1 to N4 do not coincide with the old points.

In step S76, regarding the coincided points (CP), the old points are utilized and connection points are corresponded.

In step S77, regarding the non-coincided points, the expanding unit 17 determines whether or not the non-coincided points can be included in the present fan-out group.

In step S78, when it is possible, the expanding unit 17 performs the expanding process for the non-coincided points.

In step S79, when it is impossible, the new group generating unit 18 generates the new group for the non-coincided points.

In step S80, the steps S74 to S79 are repeated until all processes are completed for all distributing points.

In step S81, a trace start point is set to the additional-regular circuit (ARC) which is provided from the additional-regular circuit storage unit 22, and the circuit is traced to determine the portions to be used in the additional circuit. Further, the circuit portions to be used in the additional circuit are extracted, and the data of the additional circuit are changed.

In step S82, the new logic circuit (LC) data including the additional circuit data are generated. The generated circuit data are stored in the new logic circuit data storage unit 20 shown in FIG. 2.

In steps S90 to S92 shown in FIG. 8B, the change of the additional-regular circuit is performed in such ways that the old logic circuit (LC) data is read (S90), the additional-regular circuit (ARC) is extracted (S91), and the additional-regular circuit data, which is stored in the storage unit 22, is updated (S92).

The expanding process in step S78 will be explained in detail with reference to FIG. 10.

The sentence (1) shows start of EXPAND process.

The sentence (2) is the sentence defining a set 0 (note, mathematical "set" 0) of the destination points (DP) before design change. The set 0 is defined as follows in the old logic circuit data shown in FIG. 9A.

set O={A1, A2, A3, B1, B2, B3, C1, C2}

In this case, since distributing points A1, A2 and A3 are supplied from one distributing gate as shown in FIGS. 9A and 9B, these points belong to the same group. This group is numbered "0". Similarly, the group of B1, B2 and B3 is numbered "1", and the group C1 and C2 is numbered "2". Further, a name of element of the set O is given by "$O_{j,\,g}$", where, "j" is the number which is sequentially attached to the element within the set O, and "g" is the group name. Accordingly, the set O is generalized as follows.

O={$O_{0,\,0}$, $O_{1,\,0}$, $O_{2,0}$, $O_{3,\,1}$, $O_{4,1}$, $O_{5,\,1}$, $O_{6,\,2}$, $O_{7,\,2}$}

This is the set O defined by the sentence (2).

Further, the set S of the destination points after design change is defined as follows in the new logic circuit data.

set S ={A1, A2, A3, B1, B2, B3, C1, C2, N1, N2, N3, N4}

Further, the name of an element within the set S is changed, and generalized as follows. Where, the element is expressed by $S_{j,\,g,\,determ=p}$, "j" is the number sequentially applied to the element from "0", "g" is the name of the distributing group. When the element does not belong to any group, the name "g" is expressed by "NULL".

When the name "g" is NULL, the "d e t e r m" is expressed by "0". This means that the element $S_{j,\,g,\,determ=p}$ does not belong to any group. When the name "g" is not NULL, the "d e t e r m" is expressed by "1". In this case, the element $S_{j,\,g,\,determ=p}$ belongs to a group. Accordingly, an initial state of the set S to which only "j" is applied can be expressed as follows.

$S = \{S_{0,\,NULL,\,determ=0},\,S_{1,\,NULL,\,determ=0},\,S_{2,\,NULL,\,determ=0}$
$S_{3,\,NULL,\,determ=0},\,S_{4,\,NULL,\,determ=0},\,S_{5,\,NULL,\,determ=0}$
$S_{6,\,NULL,\,determ=0},\,S_{7,\,NULL,\,determ=0},\,S_{8,\,NULL,\,determ=0}$
$S_{9,\,NULL,\,determ=0},\,S_{10,\,NULL,\,determ=0},\,S_{11,\,NULL,\,determ=0}\}$ The above set S is defined by a sentence (3) in FIG. 10.

Sentences (4) to (7) show processes which find points coinciding with the new point and with the old point. The result of sentences (4) to (7) can be expressed as follows. For example, since the distributing point A1 is the element $O_{0,0}$ in the set O, and is the element $S_{0,\,NULL,\,determ=0}$ in the set S, the distributing point A1 in the set S is changed to the element "$S_{0,\,0,\,determ=0}$".

$S = \{S_{0,\,0,\,determ=1},\,S_{1,\,0,\,determ=1},\,S_{2,\,0,\,determ=1}$
$S_{3,\,1,\,determ=1},\,S_{4,\,1,\,determ=1},\,S_{5,\,1,\,determ=1}$
$S_{6,\,2,\,determ=1},\,S_{7,\,2,\,determ=1},\,S_{8,\,NULL,\,determ=0}$
$S_{9,\,NULL,\,determ=0},\,S_{10,\,NULL,\,determ=0},\,S_{11,\,NULL,\,determ=0}\}$ After sentence (8), the distributing points, in which the distributing groups are not determined, are processed. The set $\{S_{j,\,NULL,determ=0} \in S\}$ shows the set of the distributing points in which the distributing point is not determined. The "WHILE" loop of the sentence (8) indicates that the processes are repeated when there are the distributing points in which the distributing groups are not determined.

The set $\{g|S_{j,\,g,\,determ=0} \in S\}$ of a sentence (9) becomes {0, 1, 2} in the above example.

Accordingly, the "f o r" loop of the sentence (9) expresses the loop which repeats x=0, x=1 and x=2 for three times.

The set $A_x$ of a sentence (10) becomes $A_0$ when a loop variable number x is 0 as follows.

$A_0$={$S_{0,\,0,\,determ=1}$, $S_{1,\,0,\,determ=1}$, $S_{2,\,0,\,determ=1}$}

The set B of sentence (11) becomes as follows.

set B={$S_{8,\,NULL,\,determ=0}$, $S_{9,\,NULL,\,determ=0}$, $S_{10,\,NULL,\,determ=0}$, $S_{11,\,NULL,\,determ=0}$}

|B| of a sentence (12) shows the number of element of the set B. Accordingly, the number of the element becomes four in the above example. That is, the sentence (12) is repeated for "f o r" loop regarding the number of distributing points which do not belong to the distributing group.

The set T of sentence (13) becomes as follows when the "X" of sentence (9) becomes 0, and the "i" of the sentence (12) becomes 0.

set T={$S_{8,\,NULL,determ=0}$}

This is because the distributing point nearest to the set $A_0$, i.e., A1, A2, A3 becomes N1.

In sentence (14), this process checks whether or not the repeater gate at the distributing point of the set $A_0$ exceeds the limit of fan-outs when the same gate is distributed to the distributing point of the set T. In a sentence (16), when the gate does not exceed the limit, the gates distributed at the points in the set $A_0$ are also distributed in the set T so as to generate the Steiner tree, and the size of the Steiner tree is replaced with "r".

When the sum of "r" and "α" (clearance portion) do not exceed the limit of wiring length, the process which includes the distributing points of the set T into the set $A_0$ in sentences (18) to (20).

We claim:

1. An automatic generation system for an additional circuit provided in a logic circuit design support system which provides the additional circuit to a logic circuit after completion of design, said automatic generation system comprising:

new distributing point extracting means for extracting points which distribute signals supplied by the additional circuit, from data of a new logic circuit before the additional circuit is connected;

old distributing point extracting means for extracting points which distribute signals supplied by the additional circuit, from data of an old logic circuit;

distributing point comparing means operatively connected to both said new and old distributing point extracting means for comparing distributing points of the new logic circuit with distributing points of the old logic circuit;

connection point corresponding means operatively connected to said distributing point comparing means for corresponding connections of the additional circuit to the distributing points of the old logic circuit and of connections of the additional circuit to the distributing points of the new logic circuit when the distributing points in the new and old logic circuits coincide;

additional circuit changing means operatively connected to said distributing point comparing means for changing a part of the additional circuit of the old logic circuit to distribute signals to distribution points added in the new logic circuit resulting in a changed additional circuit; and additional means operatively connected to said connection point corresponding means and said additional circuit changing point means for adding the changed additional circuit to the new logic circuit.

2. An automatic generation system for an additional circuit as claimed in claim 1, wherein said additional circuit changing means comprises:

an expanding processing means for expanding fan-out groups of distributing points in the old logic circuit, and taking expanded fan-out groups into the fan-out group which satisfies a predetermined limit for the number of connections of distributing lines in the distributing points which are added in the new logic circuit; and a new group generating means for generating a new fan-out group which satisfies the above limit, and for assigning distributing points to the new fan-out group regarding the distributing points which are not included in any fan-out group.

3. An automatic generation system for an additional circuit as claimed in claim 2, wherein said expanding processing means comprises means for prohibiting processing which includes the distributing points added in the new logic circuit, regarding the fan-out groups which were previously designated as having exceeded limitations.

4. An automatic generation system for an additional circuit as claimed in claim 1, further comprising:

additional-regular circuit storage means for storing information of a regular additional circuit which is added to the new logic circuit; and additional-regular circuit updating means for extracting information of the additional circuit from the old logic circuit, and for updating information of the regular additional circuit in accordance with the extracted data.

5. An automatic generation system for an additional circuit as claimed in claim 4, wherein the information of the regular additional circuit which is stored in said additional-regular circuit storage means includes information which includes non-used circuit portions in the logic circuit, and the non-used circuit portions are used in said additional circuit changing means.

6. An automatic generation method for adding an additional circuit after completion of design to an old logic circuit to produce a new logic circuit, comprising:

(a) extracting points of the new logic circuit distributing signals output by the additional circuit;

(b) extracting points of the old logic circuit distributing signals output by the additional circuit;

(c) comparing the points of the new logic circuit extracted in step (a) with the points of the old logic circuit extracted in step (b) to determine coincident points;

(d) matching up distribution of the additional circuit to the new logic circuit using the coincident points determined in step (c);

(e) modifying the additional circuit to distribute signals to distribution points added in the new logic circuit resulting in a modification to the additional circuit if no coincident points are found; and (f) inserting the additional circuit into the new logic circuit.

* * * * *